(12) United States Patent
Bae et al.

(10) Patent No.: US 7,009,405 B2
(45) Date of Patent: Mar. 7, 2006

(54) METHOD AND APPARATUS FOR TESTING FLAT DISPLAY APPARATUS

(75) Inventors: Sung Joon Bae, Kyounggi-do (KR); Jong Dam Kim, Kyounggi-do (KR); Hyun Kyu Lee, Seoul (KR); Yong Jin Cho, Seoul (KR); See Hwa Jeong, Kyounggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/670,373

(22) Filed: Sep. 26, 2003

(65) Prior Publication Data

US 2004/0222816 A1   Nov. 11, 2004

(30) Foreign Application Priority Data

May 6, 2003   (KR) ..................... 10-2003-0028641

(51) Int. Cl.
 *G01R 31/28*   (2006.01)
 *G01R 31/26*   (2006.01)

(52) U.S. Cl. .................. 324/529; 324/770; 324/158.1; 702/59

(58) Field of Classification Search ................ 324/529, 324/770, 750–765
See application file for complete search history.

(56) References Cited

U.S. PATENT DOCUMENTS

| | | | | |
|---|---|---|---|---|
| 5,073,754 A | * | 12/1991 | Henley | ....................... 324/529 |
| 5,285,150 A | * | 2/1994 | Henley et al. | ............... 324/770 |
| 6,242,923 B1 | * | 6/2001 | Scaman et al. | ............. 324/529 |
| 6,323,653 B1 | * | 11/2001 | Field et al. | .................. 324/529 |
| 2004/0222814 A1 | * | 11/2004 | Kim et al. | ................... 324/770 |

* cited by examiner

*Primary Examiner*—Ernest Karlsen
*Assistant Examiner*—Emily Y Chan
(74) *Attorney, Agent, or Firm*—Birch, Stewart, Kolasch & Birch, LLP

(57) ABSTRACT

A method and apparatus tests a flat display device to inspect for shorts and open circuits in a signal wire by using a magnetic sensor. The inspection method and apparatus scans the magnetic sensor along signal wires in a scan direction crossing multiple signal wires and detects at least one of a short or an open circuit in the signal wires based on current detected by the magnetic sensor.

24 Claims, 18 Drawing Sheets

FIG.3
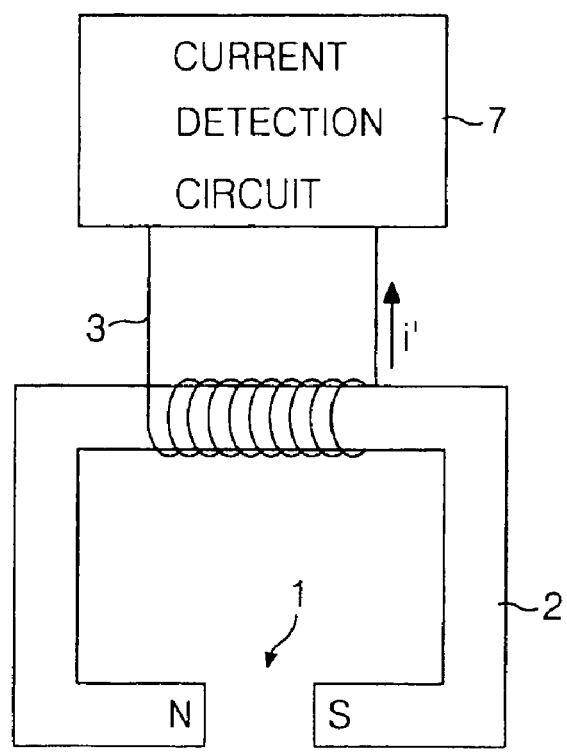
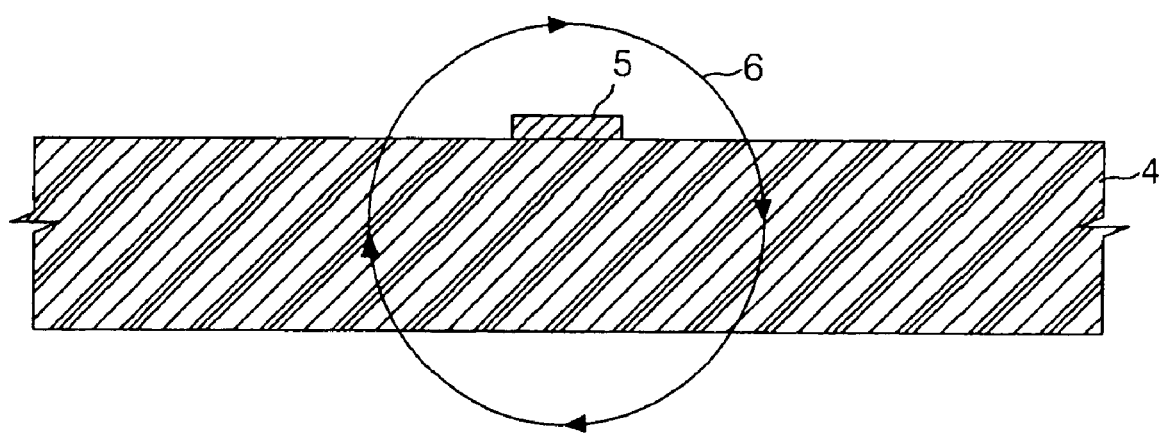

FIG.5
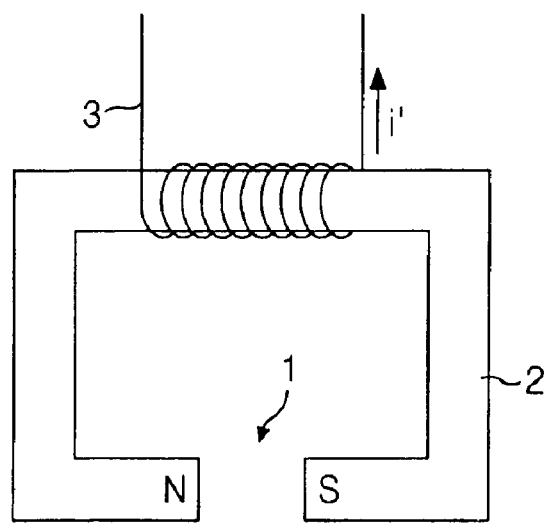
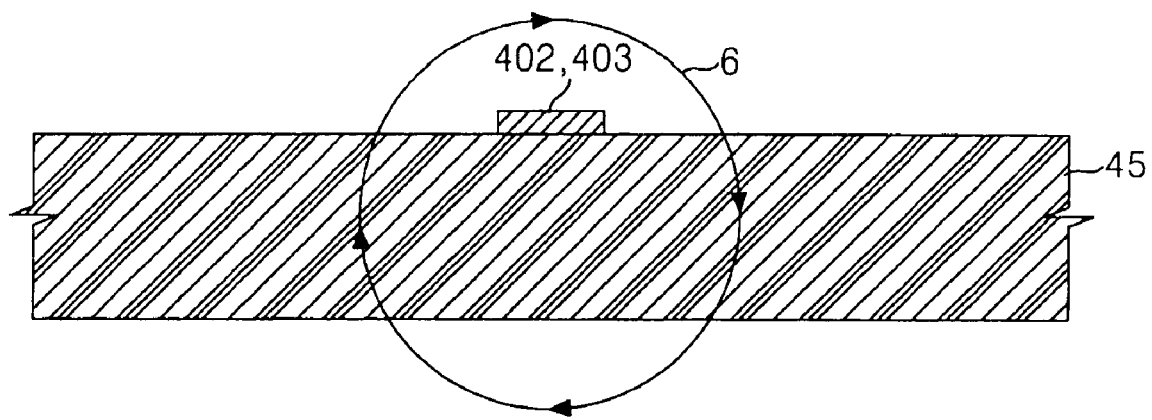

FIG.6
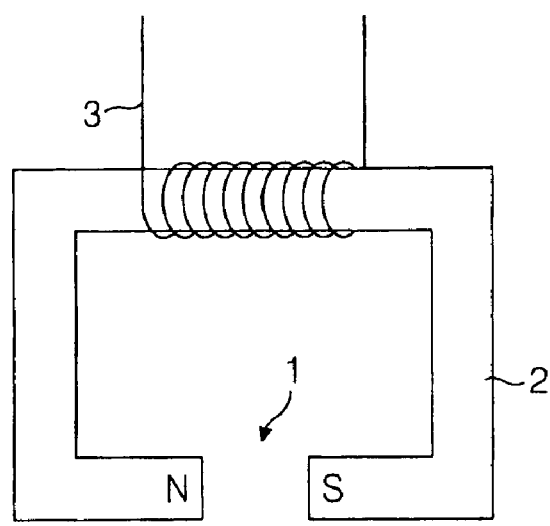
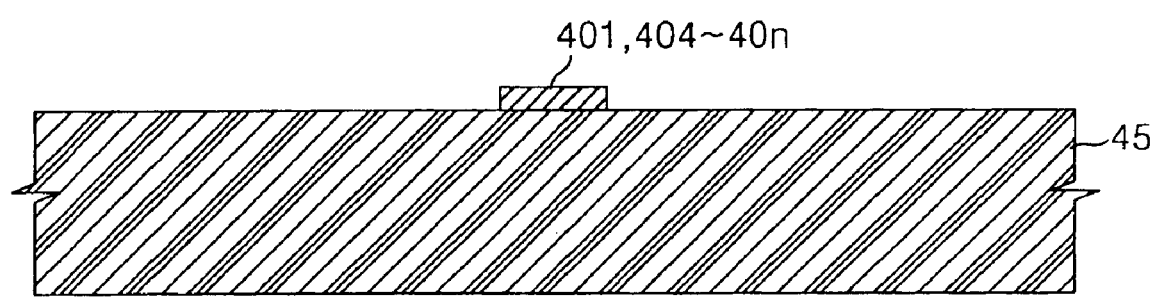

FIG.11
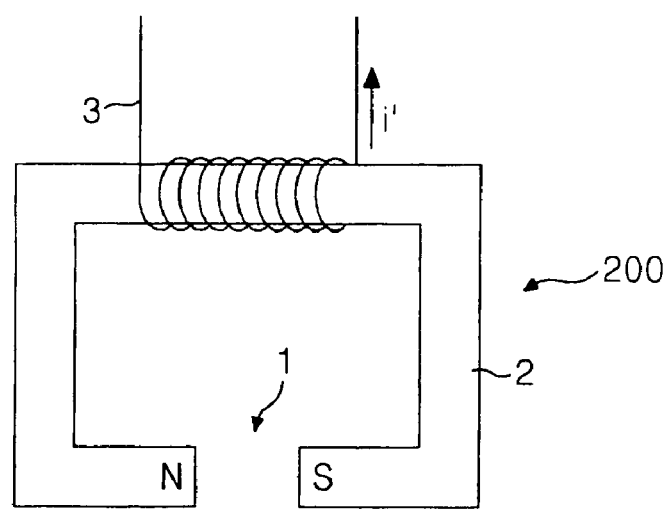
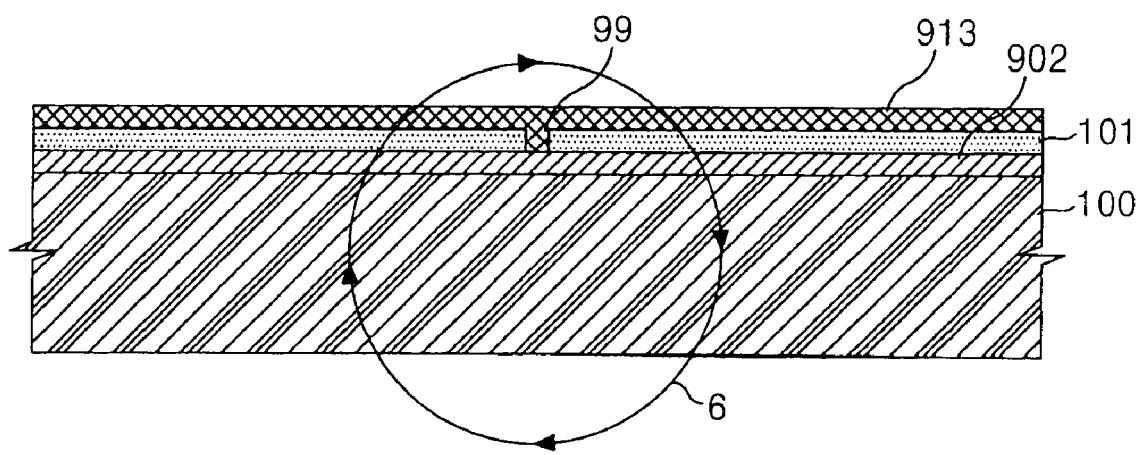

FIG.16
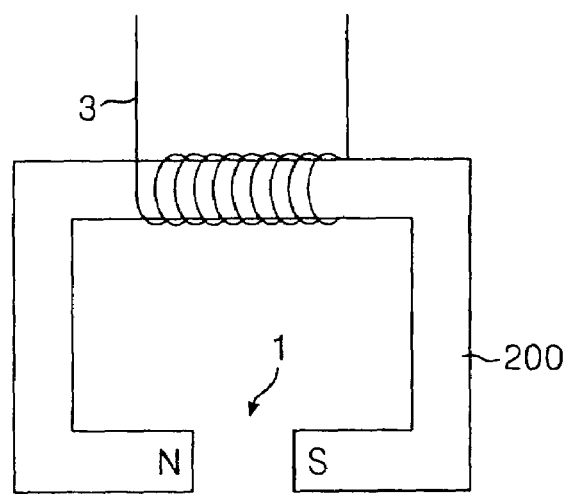
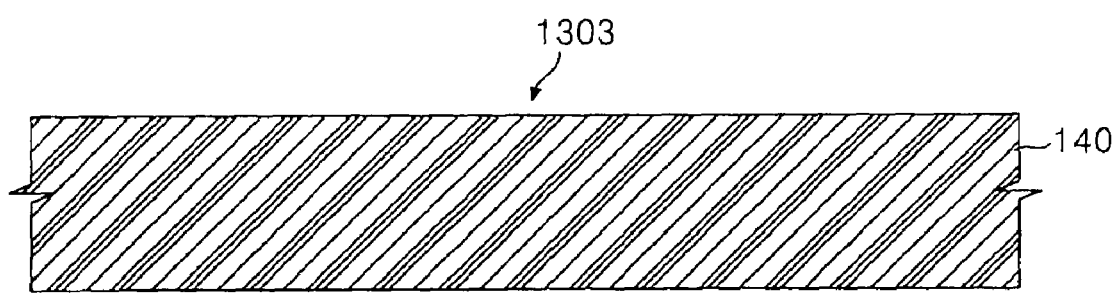

METHOD AND APPARATUS FOR TESTING FLAT DISPLAY APPARATUS

This application claims priority under 35 U.S.C. §119 of Korea P2003-28641, filed May 6, 2003, the entire contents of which is hereby incorporated by reference.

BACKGROUND OF THE INVENTION

1. Field of the Invention

The invention pertains to a flat display apparatus, and more particularly to a method and apparatus that inspects for shorts and open circuits in the signal wires of a flat display apparatus by using a magnetic sensor.

2. Description of the Related Art

The importance of a display apparatus as a visual information transfer medium has recently enlarged. Widely used conventional cathode ray tubes have undesirable weight and large volume. There has therefore been developed various types of flat display apparatuses capable of overcoming the disadvantages of cathode ray tubes.

Examples of currently commercially available flat panel displays include a liquid crystal display (LCD), a field emission display (FED), a plasma display panel (PDP) and an electroluminescence display (EL).

The liquid crystal display device readily adapts for miniaturization and has the additional advantage of improved productivity. Thus, LCDs are fast replacing the cathode ray tube in many applications.

Specifically, an active matrix type liquid crystal display apparatus that drives a liquid crystal cell by using a thin film transistor (hereinafter referred to as "TFT") has an advantage of excellent picture quality combined with low power consumption. This technology has rapidly developed to large volume production of high definition displays due to recent research and the application of productivity technology.

The process for fabricating an active matrix type liquid crystal display apparatus is divided into substrate cleaning, substrate patterning, alignment forming/rubbing, substrate assembling/liquid crystal material injecting, mounting, inspecting, repairing, etc.

Impurities on a substrate surface of the liquid crystal display during the substrate cleaning process are removed by a detergent.

The substrate patterning process includes patterning of an upper substrate, i.e., a color filter substrate and a patterning of a lower substrate of, for example, a TFT array substrate. There are formed a color filter, a common electrode, a black matrix, etc. on the upper substrate. There are also formed signal wires such as a data line and a gate line on the lower substrate. The TFT is formed at an intersection of the data line and the gate line, and a pixel electrode is formed in a pixel region between the gate line and the data line connected to a source electrode of the TFT.

An alignment film is applied to each of the upper substrate and the lower substrate during the alignment film forming/rubbing process, and the alignment film is rubbed by a rubbing material.

During the substrate assembling/the liquid crystal injection process, both of the upper substrate and the lower substrate are bonded together with a sealant, and the liquid crystal material and a spacer are injected through a liquid crystal injection hole. Then, the liquid crystal injection hole is sealed.

The mounting process of the liquid crystal panel uses a tape carrier package (hereinafter referred to as "TCP") having integrated circuits mounted thereon, such as a gate drive integrated circuit and a data drive integrated circuit connected to a pad part on the substrate. Such integrated driving circuits may be directly mounted on the substrate by using a chip on glass (herein after referred to as "COG") method other than TAB (Tape Automated Bonding) using the TCP described above.

The inspecting process includes a first electrical inspection performed after a variety of signal wires and the pixel electrode are formed. An electrical inspection and a visual inspection are performed after the substrate assembly/liquid crystal injection process. Specifically, the electrical inspection of the signal wire and the pixel electrode of the lower substrate, followed by the substrate assembling, may reduce the defect ratio and the amount of waste matter. Also, a bad substrate may be capable of repair at an early stage, and thus its importance gradually increases.

The repairing process performs a restoration of a repairable substrate that is determined during the inspecting process. However, in the inspecting process, bad substrates that are beyond repair are discarded.

The electrical inspection being performed before substrate assembly frequently employs a method using an apparatus shown in FIG. 1.

Referring to FIG. 1, the electrical inspection process is performed as follows: a separate modulator 10 has a designated gap over a test substrate 11. Applying a test voltage (Vtest) to the modulator, while maintaining the gap, and detecting light reflected from the modulator 10 determines any electrical defects in the signal wires 17 and 18.

In the modulator 10, a polymer-dispersed liquid crystal (hereinafter referred to as "PDLC") is put between an upper transparent substrate 12, having a common electrode 13, and the lower transparent substrate 15. In the modulator 10, a reflection sheet 16 is placed toward a rear surface of the lower transparent substrate 15. The modulator 10 has an air nozzle and a vacuum nozzle for an auto-gapping to maintain the designated interval from the detected substrate 11.

Above the modulator 10, a lens 21 light-gathers the light from a light source (not shown) into the modulator 10, and the lens 21 additionally transmits the light 22 reflected from the modulator 10.

The substrate 11 to be tested is the lower substrate on which is found the TFT, the signal wires 17 and 18 and the pixel electrode 20, which form the active matrix type liquid crystal display apparatus. The test substrate 11 shown in FIG. 1 is an equivalent circuit showing a portion of the total TFT array.

The test substrate 11 is loaded below the modulator 10, and then the modulator descends and performs the auto-gapping. Then, the electrical inspection begins. While the gap between the modulator 10 and the test substrate 11 is maintained at a pre-set effective gap, the light radiated from the light source (not shown) is light-gathered in the modulator 10 by the light-gathering lens, and the test voltage (Vtest) is simultaneously applied to the common electrode 13. The test data is applied from a driving circuit to the data wire 17, and a test scan signal is applied to the gate wire 18. Then, an effective electric field is applied to the PDLC 14 between the common electrode 13 of the modulator 10 and the pixel electrode 20 to be tested.

When the electric field is not applied, the PDLC 14 causes the light to scatter. When the effective electric field (E) is applied, the liquid crystal orients according to the direction of the effective electric field (E) and causes the light to transmit. Accordingly, in the electrical inspection process, when the voltage is normally applied to the pixel electrode 20, the corresponding liquid crystal layer of the PDLC 14 causes the light 22 to transmit. When the voltage is not applied to the pixel electrode 20, the liquid crystal layer of the PDLC 14 causes the light to scatter in that part.

While the light 22 transmitting to the liquid crystal layer of the PDLC 14 is reflected on the reflection sheet 16 and is reverse directed to a light path, the light 22 scattered in the liquid crystal layer of the PDLC 14 nearly vanishes and is not nearly incident to the reflection sheet 16. The light reflected in the modulator 10 is received to a charge-coupled device (CCD) (not shown) via the lens 21 and then is converted to an electrical signal. The received signal converted electrically is then transferred to a display apparatus (not shown) via a signal processing circuit. A testing inspector monitors an image or data displayed in the display apparatus to determine whether it is bad or not. The testing inspector secondarily performs a close inspection of doubtful points the signal (data and gate) wires 17 and 18.

The modulator 10 also has an advantage of exactness and reliability capable of inspecting for defects pixel by pixel, but it has a defect of high price. Further, since the inspection region is narrow as compared with total substrate 11 area, the modulator 10 repeats the process of transferring by a designated length in a vertical or a horizontal direction, and then stopping temporarily for auto-gapping. There is thus the disadvantage that the inspection time becomes long. That is, as shown in FIG. 2, the modulator 10 scans the obliquely lined part smaller than the substrate 11 at the incipient location, and then moves and stops at an adjacent sub-block, and then performs auto-gapping and scanning. The stepping, the auto-gapping and the moving are repeated in the horizontal direction and in the vertical directions. For example, in order to entirely scan a substrate having a size of 14.1 inches (36 cm), the modulator repeats fourteen times the step of auto-gapping and then moving. Accordingly, the inspection method of using the modulator 10 has a disadvantageously long inspection time.

SUMMARY OF THE INVENTION

Accordingly, an object of the invention is to provide a method and apparatus to inspect a flat display apparatus for inspecting for a short or an open circuit in signal wires in a flat display device by using a magnetic sensor.

In order to achieve these and other objects of the invention, the invention includes, in part, an inspection method for a flat display device that entails scanning signal wires by using a magnetic sensor along a scan direction crossing a plurality of the signal wires and detecting at least one of a short or an open circuit in the signal wires based on a current of the signal wires detected by the magnetic sensor. The method also includes supplying a first common voltage to one side of odd-numbered signal wires within the plurality of signal wires, supplying a second common voltage different from the first common voltage to one side of even-numbered signal wires within the plurality of signal wires, and maintaining the other side of each of the signal wires in an insulated state. In the method, other steps can include detecting a short point by scanning the shorted signal wires along a second scan direction identical with a longitudinal direction of the signal wires, supplying a first common voltage to one side of odd-numbered signal wires, supplying a second common voltage different from the first common voltage to one side of even-numbered signal wires, and shorting the other side of each of the signal wires.

The invention, in part, pertains to an inspection method that includes providing a flat display device having at least one of first signal wires and at least one of second signal wires stacked on the first signal wire, and an insulation layer is located between the first and the second signal wires, scanning the second signal wires along a first scan direction crossing the first signal wires and a second scan direction crossing the second signal wires by using a magnetic sensor, and detecting an interlayer short on the signal wires based on a current of the signal wires detected by the magnetic sensor. The method can also include supplying a first common voltage to one side of the first signal wires, supplying a second common voltage different from the first common voltage to one side of the second signal wires, and maintaining an other side of each of the first and the second signal wires in an insulated state.

The invention, in part, pertains to an inspection method for a flat display device that includes scanning signal wires by using a magnetic sensor along the a scan direction proceeding in a zig-zag pattern, and detecting a short in the signal wires based on a current of the signal wires detected by the magnetic sensor. The method can also include supplying a first common voltage to one side of a first signal wire of the adjacent signal wires, supplying a second common voltage different from the first common voltage to one side of a second signal wire adjacent to the first signal wire, and maintaining the other side of each of the signal wires in an insulated state.

The invention, in part, pertains to an apparatus for inspecting a flat display device that includes a magnetic sensor for scanning on signal wires along a scan direction crossing a plurality of the signal wires, and a detection circuit for detecting at least one of a short or an open circuit on the signal wires, the detection circuit being formed based on current of the signal wires detected by the magnetic sensor. The magnetic sensor can be one of an inductive sensor, a giant magneto-resistance sensor, a magneto-resistance sensor, a tunneling magneto-resistance sensor or a fluxgate sensor. The apparatus can also include a first power supply for supplying the first common voltage to one side of odd-numbered signal wires, and a second power supply for supplying the second common voltage different from the first common voltage to one side of even-numbered signal wires. Also, another side of each of the signal wires is maintained in an insulated state during a short inspection of the signal wires. The magnetic sensor can perform a secondary scanning on at least one of the shorted signal wires along a second scan direction parallel with a longitudinal direction of the signal wires to locate a shorted point. Also, another side of each of the signal wires is shorted upon an open circuit inspection of the signal wires.

The invention, in part, pertains to an inspection apparatus for a flat display device having at least one of a first signal wire, an insulation layer over the first signal wire, and a second signal wire over the insulation layer, the inspection apparatus including a magnetic sensor for scanning the first and the second signal wires along a first scan direction crossing the first signal wire and a second scan direction crossing the second signal wire, and a detection circuit for detecting an interlayer short in the signal wires based on a current of the signal wires detected by the magnetic sensor. The magnetic sensor can be one of an inductive sensor, a giant magneto-resistance sensor, a magneto-resistance sensor, a tunneling magneto-resistance sensor or a fluxgate sensor. The apparatus can also have a first power supply for supplying a first common voltage to one side of the first signal wire, and a second power supply for supplying the second common voltage different from the first common voltage to one side of the second signal wire. Also, another side of each of the first and the second signal wires is maintained in an insulated state.

The invention, in part, pertains to an inspection apparatus for a flat display device that includes a magnetic sensor for scanning signal wires along a scan direction proceeding in a zig-zag pattern between adjacent signal wires, and a detection circuit for detecting a short on the signal wires based on a current of the signal wires detected by the magnetic sensor. The magnetic sensor can be one of an inductive sensor, a giant magneto-resistance sensor, a magneto-resistance sensor, a tunneling magneto-resistance sensor or a fluxgate sensor. The apparatus can also include a first power supply for supplying a first common voltage to one side of a first signal wire of the adjacent signal wires, and a second power supply for supplying a second common voltage different from the first common voltage to one side of a second signal wire adjacent to the first signal wire. Another side of each of the signal wires can be maintained in an insulated state.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

FIG. 3 illustrates an inductive sensor according to an embodiment of the present invention.

FIG. 5 is a cross sectional diagram illustrating an inductive sensor when current flows in the signal wire shown in FIG. 4.

FIG. 6 is a cross sectional diagram illustrating an inductive sensor when current does not flow in the signal wire shown in FIG. 4.

FIG. 11 is a cross sectional diagram illustrating an inductive sensor when current flows in the signal wire shown in FIG. 9.

FIG. 16 is a cross sectional diagram illustrating an inductive sensor when current does not flow in a signal wire shown in FIG. 13.

DETAILED DESCRIPTION

Figure 1:
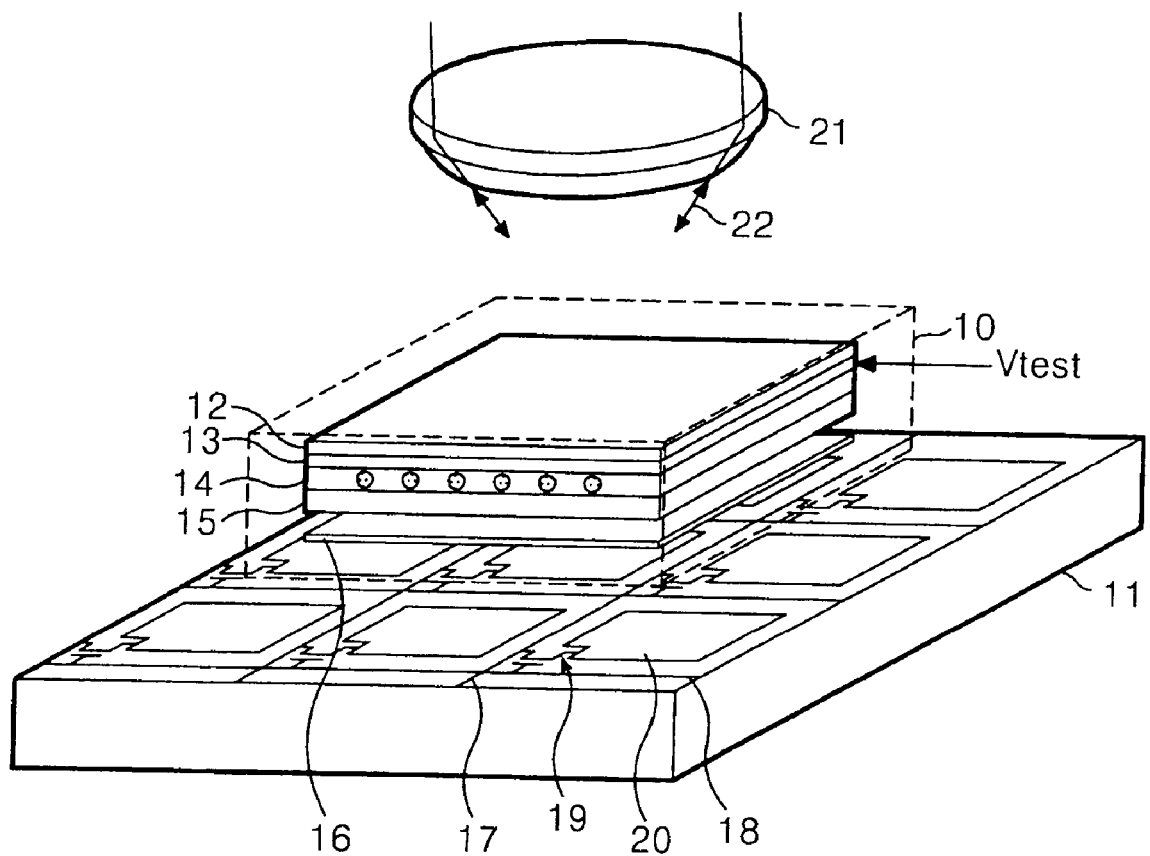
FIG. 1 is a perspective view of an apparatus for electrically inspecting a liquid crystal display according to the related art.
Figure 2:
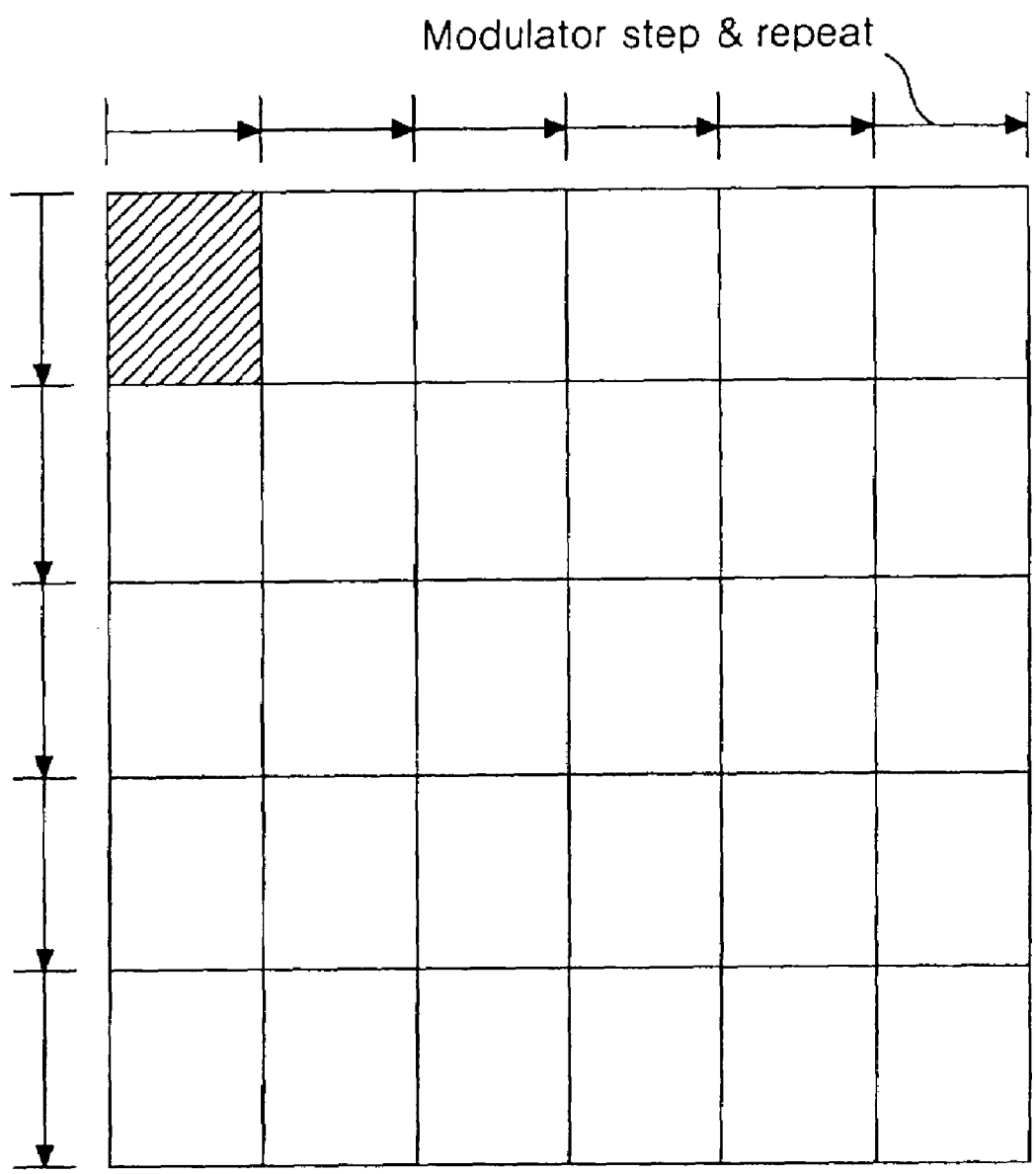
FIG. 2 schematically illustrates a block moving according to a step-by step inspection method performed in the inspection apparatus shown in FIG. 1.

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Hereinafter, with reference to FIGS. 3 to 17, preferred embodiments of the invention will be fully explained.

An inspection method and an apparatus according to the invention inspects for a short and an open circuit that can be generated in signal wires of a flat display device by using variety of magnetic sensors such as an inductive sensor, a giant magneto-resistance sensor (GMR), a magneto-resistance sensor (MR) or a fluxgate sensor. Among these sensors, the inductive sensor will be mainly explained. The invention, however, is not restricted to inductive sensors, and any appropriate magnetic sensor type can be used to practice the invention.

Referring to FIG. 3, the inductive sensor includes a magnetic material 2 bent in order to face a gap 1 and a coil 3 wound on the magnetic material 2.

When an external or an induced magnetic field is induced to the magnetic material 2, both facing ends that form the gap 1 are magnetized with a polarity opposite from each other.

The coil 3 generates a current using the magnetic field induced in the magnetic material 2.

If the inductive sensor scans the signal wire 5 of the flat display apparatus, the current i' generates in the coil 3 wound on the magnetic material 2 by the induced magnetic field 6 generated when the current flows in the signal wire 5. The current i' flowing in the coil 3 is detected by a current detection circuit 7.

In order to improve the precision of the inspection, the gap 1 of the inductive sensor is preferably set below the width of the signal wire 5 that will be inspected. For example, the gap 1 may be set within several $\mu$m to several tens of $\mu$m. The gap, however, is not restricted to this range and can be set, for example, to a sub-micron value or to a value in excess of about 100 $\mu$m.

Figure 4:
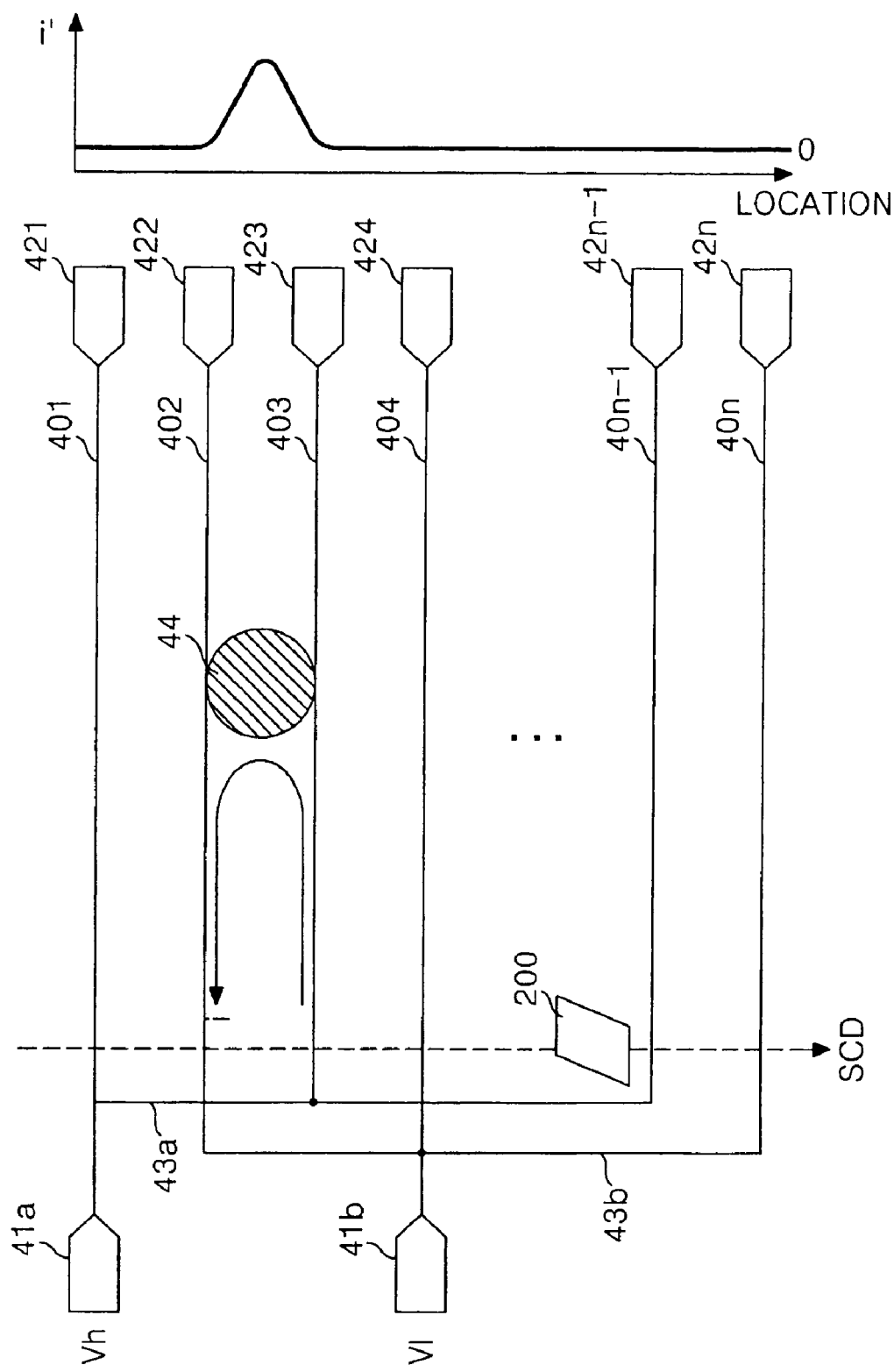
FIG. 4 illustrates an inspection method and an apparatus of the flat display apparatus according to a first embodiment of the present invention.

Referring to FIG. 4, the inspection method and the apparatus according to a first embodiment of the invention supplies a high common voltage Vh to one side of odd-numbered signal wires 401, 403, . . . , 40n-1. A low common voltage Vl is supplied to one side of even-numbered signal wires 402, 404, . . . , 40n. The signal wire 401 to 40n are scanned by inductive sensor 200 along the secondary direction SCD crossing the signal wires 401 to 40n to inspect the short of the signal wires 401 to 40n.

As shown in FIG. 5 and FIG. 6, the signal wires 401 to 40n are scan signal wires (or gate wires, low wires) formed on the substrate 45 of the flat display device or data signal wires (or column wires) crossing thereto.

The odd-numbered signal wires 401, 403, . . . , 40n-1 are connected to a first shorting wire 43a on one side to make a short circuit that is electrically isolated from even-signal wires 402, 404, . . . , 40n. The first shorting wire 43a connects to a first inspection pad 41a supplied with the high common voltage Vh. The even-signal wires 402,404, . . . , 40n connect to a second shorting wire 43b on one side to make a short circuit electrically isolated from odd-signal wires 401, 403, . . . , 40n1. The second shorting wire 43b is connected to a second inspection pad 41b supplied with a low common voltage Vl.

Signal pads 421 to 42n are formed at the other sides of the signal wires 401 to 40n respectively. The signal pads 421 to 42n are connected to an output terminal of a driving integrated circuit (not shown) in the TCP process or the COG process.

After the inspection process, the inspection pads 41a and 41b and the shorting wires 43a and 43b are separated from the TFT array substrate at the time of the scribing process.

During the short inspection on the signal wires 401 to 40n, the inductive sensor 200 is scanned by a non-contacting method in accordance with a scan direction SCD crossing the signal wires 401 to 40n. If the second and the third signal wires 402 and 403 become shorted due to impurities or to a bad pattern generated in the fabricating process as shown in FIG. 4, the current i does not flow in the first signal wire 401 and the fourth to the $n_{th}$ signal wires 404 to 40n, but the current i flows via a short point 44 on the second and the third signal wires 402 and 403. At this time, since a high voltage Vh is applied to the odd-numbered signal wires 401, 403, . . . , 40n-1 and the low voltage Vl is applied to the even-numbered signal wires 402, 404, . . . , 40n, the current i flows from the third signal wire 403 to the second signal wire 402. Then, as shown in FIG. 5, the current i flows between the second signal wire 402 and the third signal wire 403, and thus a magnetic field 6 is induced in the inductive sensor 200. Accordingly the current i' flows on the coil 3 of the inductive sensor 200 by the induced magnetic field 6. On the other hand, as shown in FIG. 6, the current i does not flow in the first signal wire 401 and the fourth to the $n_{th}$ signal wires, and thus the magnetic field is not induced in the inductive sensor 200.

Figure 7:
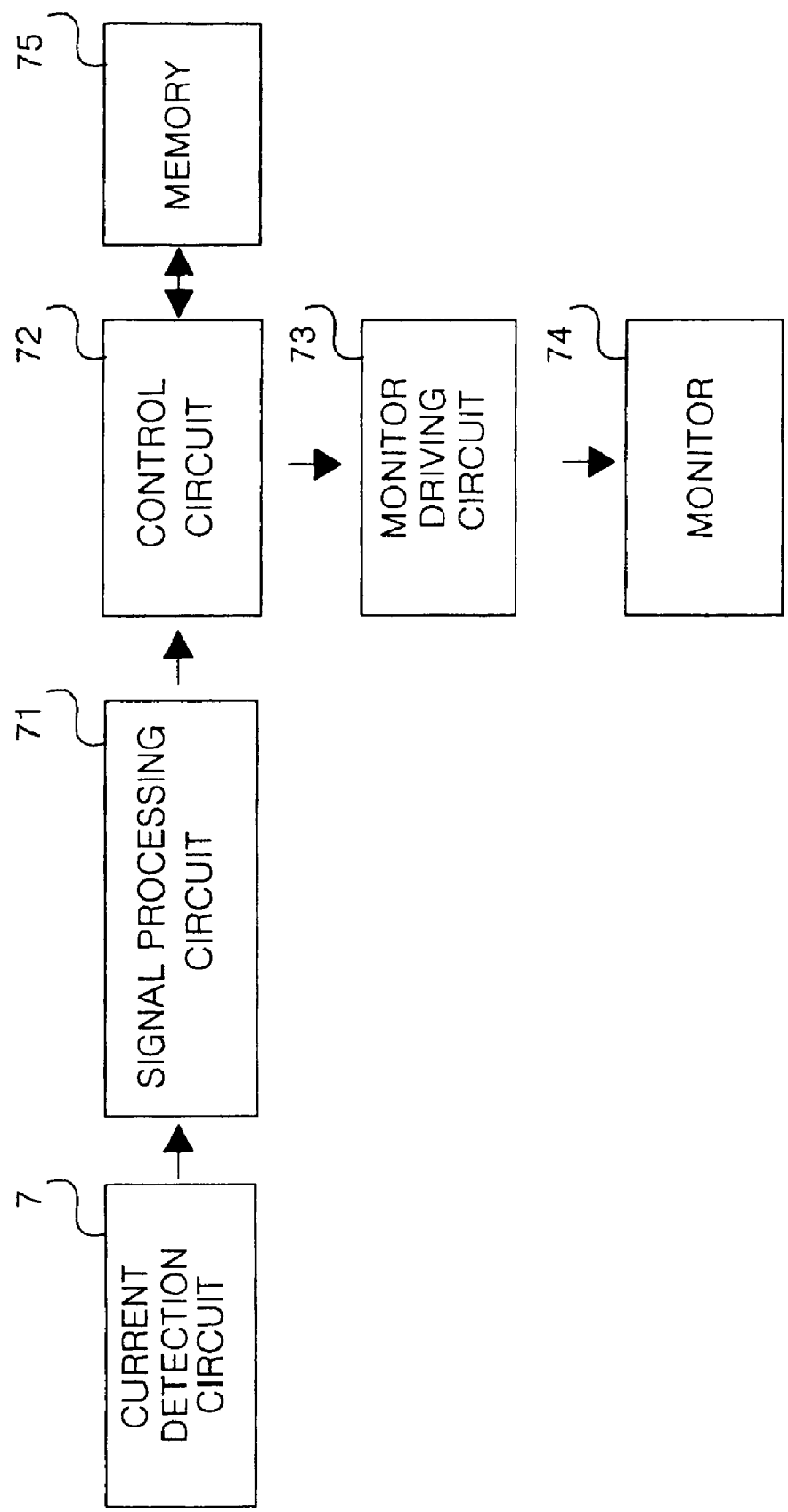
FIG. 7 illustrates a block diagram of an inspection apparatus in accordance with a preferred embodiment of the invention.

As shown in FIG. 7, the current detected by a current inspection circuit 7 is converted into a digital signal by a signal processing circuit 71 to be amplified and then displayed on a monitor under the control of the control circuit 72 and the monitor driving circuit 73. Accordingly, an inspector sees the data displayed on the monitor and recognizes that the second and the third signal wires 402 and 403 are shorted. The control circuit 72 stores in a memory 75 the data provided from the signal driving circuit 73 and compares the data stored in the memory 75 to a reference data, i.e., a reference circuit to determine the short circuit in the signal wires.

Figure 8:
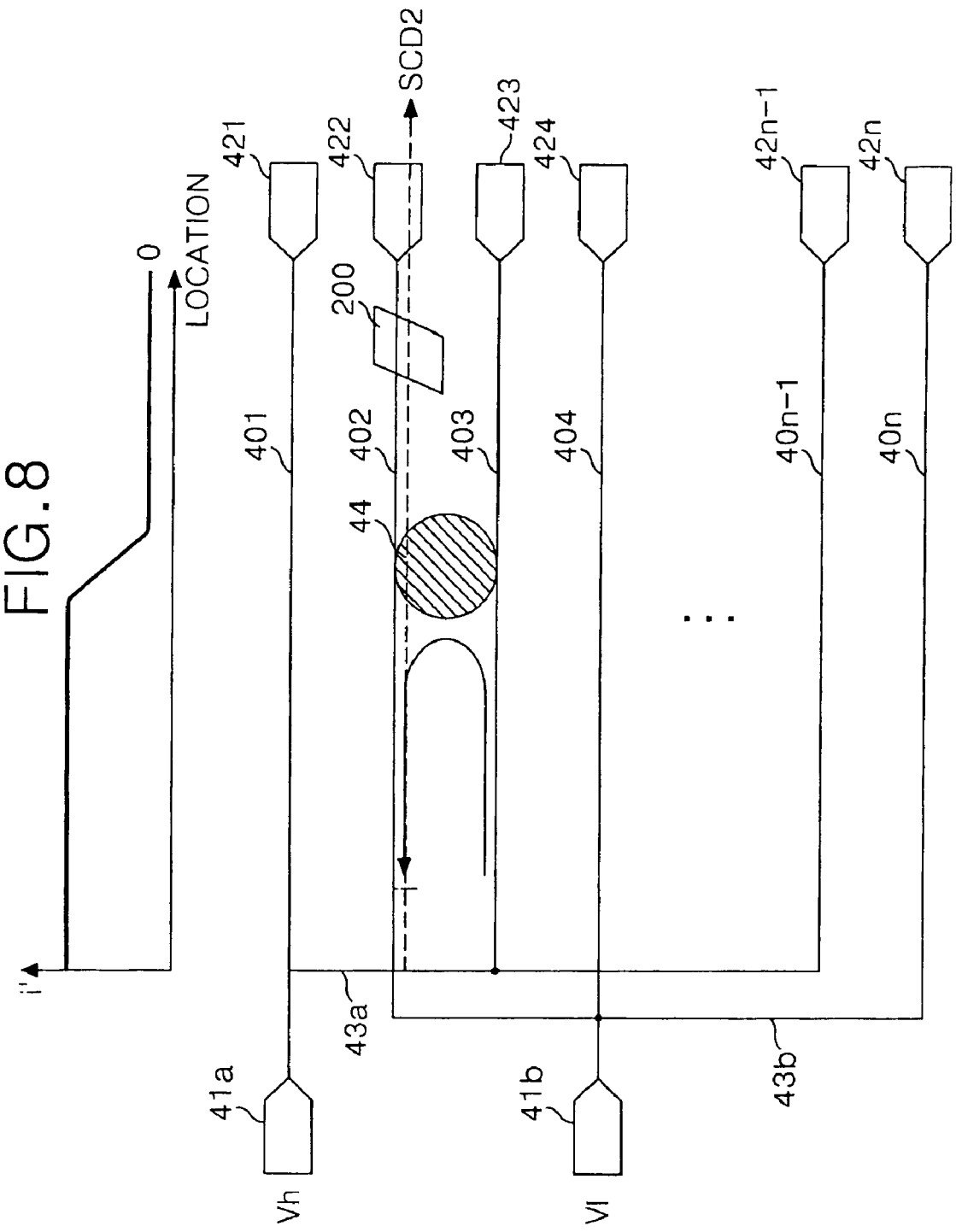
FIG. 8 illustrates secondary scanning of a shorted signal wire in an inspection method and apparatus of a flat display according to a first embodiment of the invention.

After the shorted signal wire is detected, the inspector, as shown in FIG. 8, scans the inductive sensor 200 along a scan direction SCD2 proceeding to the shorted second signal wire 402 or the third signal wire 403 and finds the shorted point having the changed current i' of the inductive sensor 200.

Figure 9:
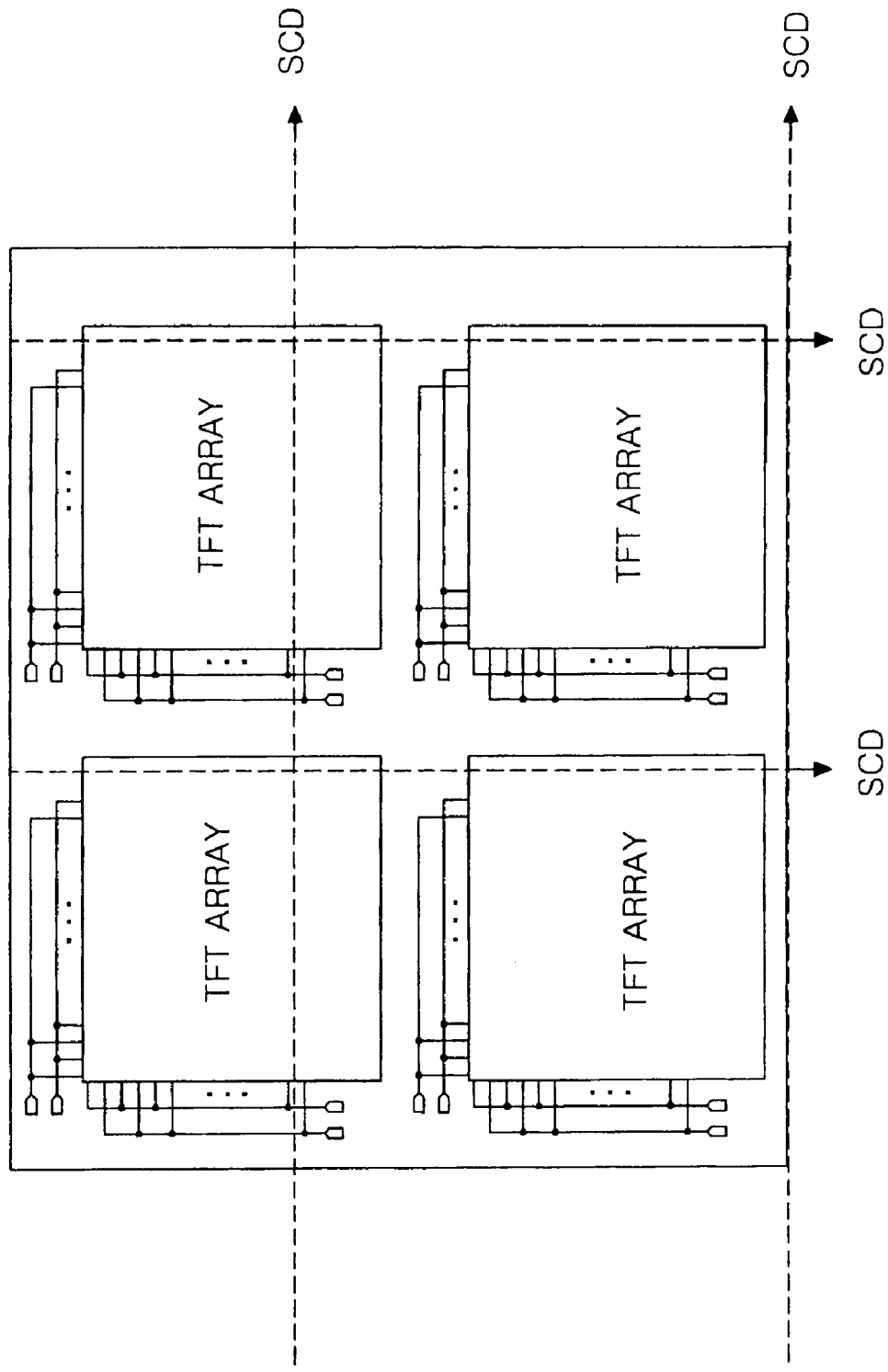
FIG. 9 illustrates a scan method performed on a substrate before being subjected to a scribing process in an inspection method and apparatus for a flat display according to a first embodiment of the invention.

As shown in FIG. 9, the short inspection on the signal wires 401 to 40n may be carried out collectively with respect to the substrate, having a plurality of TFT array formed thereon, before the scribing process. Similar to the above case, the inductive sensor 200 detects the current flowing in the signal wire 401 to 40n by scanning along the scan direction SCD crossing the signal wires 401 to 40n.

Figure 10:
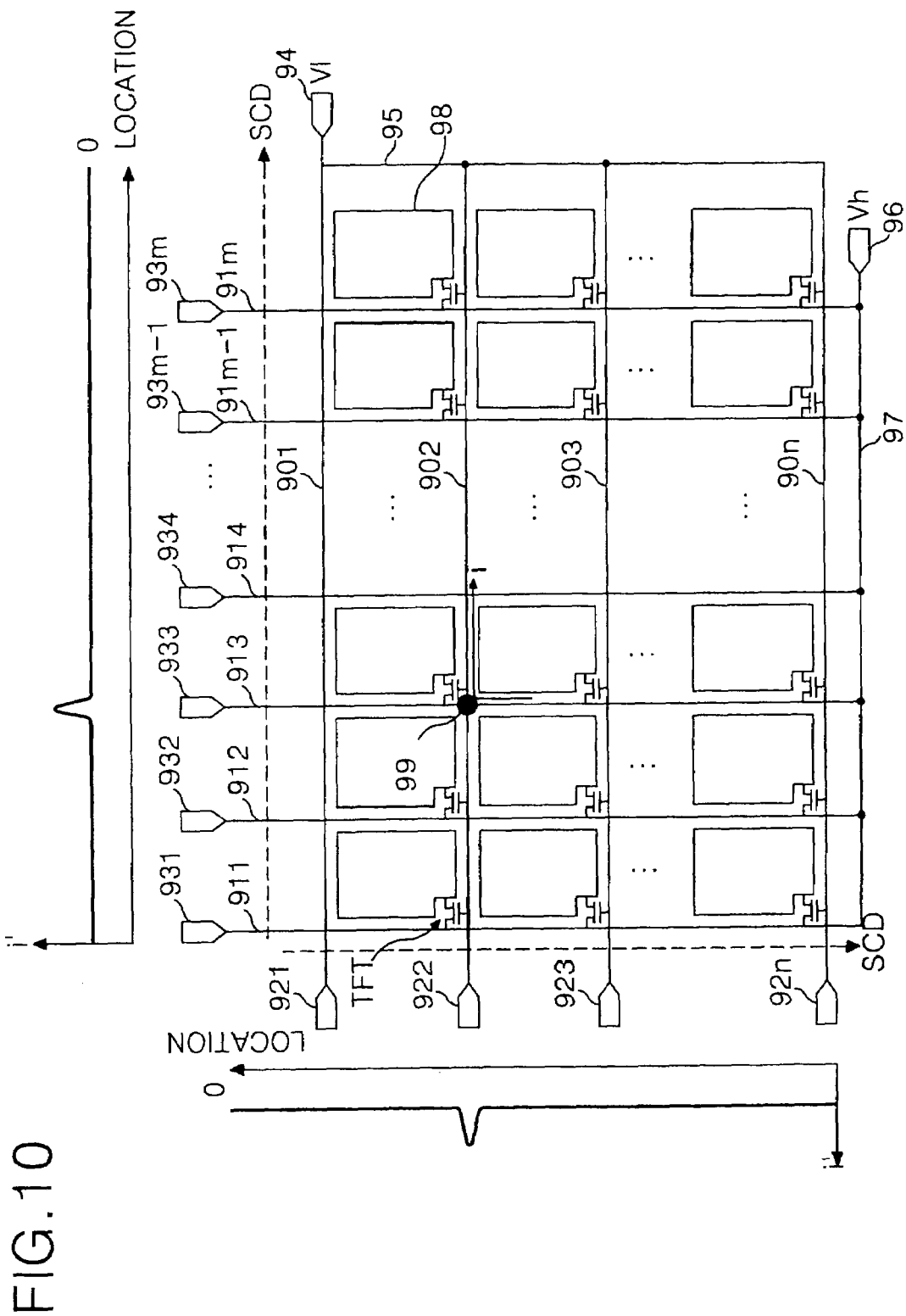
FIG. 10 illustrates an inspection method and apparatus for a flat display according to a second embodiment of the present invention.
Figure 12:
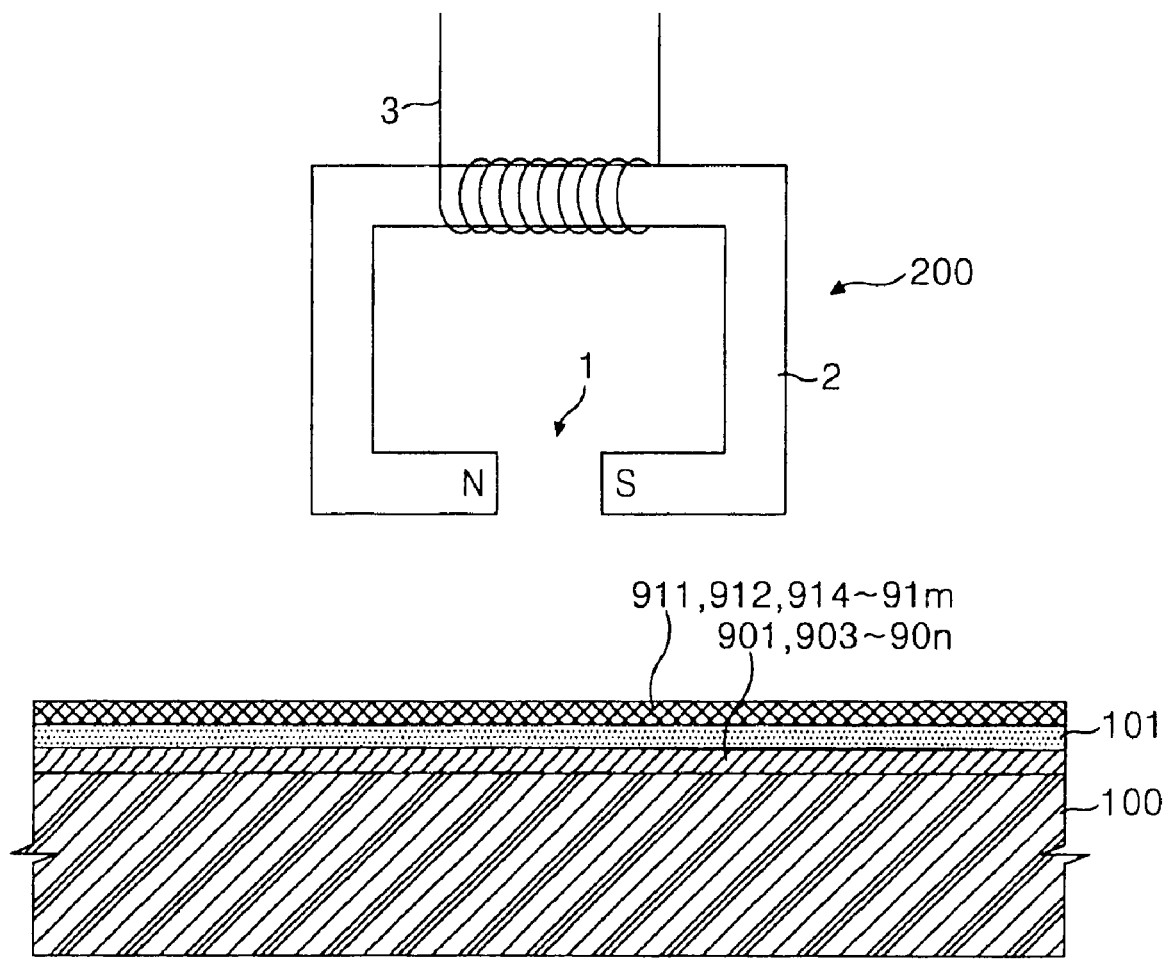
FIG. 12 is a cross sectional diagram illustrating an inductive sensor when current does not flow in the signal wire shown in FIG. 9.

FIGS. 10 to 12 illustrate an inspection method for a flat display device according to a second embodiment of the invention. It shows an inspection method when the signal wires respectively formed on another layer are shorted.

Referring to FIG. 10, the inspection method according to the second embodiment of the invention has the high common voltage Vh being supplied to one side of the data signal wires 911 to 91m, and the low common voltage Vl is supplied to one side of scan signal wires 901 to 90n crossing the data signal wires 911 to 91m.

The data signal wires 911 to 91m are connected to one side of a first shorting wire 97. The first shorting wire 97 is connected to a first inspection pad 96 having the high common voltage (Vh) supplied. The signal pads 931 to 93m are formed at the other side of the data signal wires 911 to 91m.

The scan signal wires 901 to 90n are connected to one side of a second shorting wire 95. The second shorting wire 95 is connected to a second inspection pad 94 having the low common voltage Vl supplied. Scan pads 921 to 92n are formed at the other side of the scan signal wires 901 to 90n.

The inspection pads 94 and 96, and the shorting wires 95 and 97 are separated from the TFT array substrate during the scribing process after the inspection process.

When the flat display device is a liquid crystal display, a TFT is formed at each intersection of the data signal wires 911 to 91m and the scan signal wires 901 to 90n. The TFT is turned on when the scan voltage higher than the TFT's threshold voltage is applied via the scan signal wires 901 to 90n to supply a data voltage on the data signal wires 911 to 91m to the pixel electrode 98.

Further according to the inspection method of the flat display device according to the second embodiment of the invention, the inductive sensor 200 scans the data signal wires 911 to 91m along the scan direction SCD crossing the data signal wires 911 to 91m, and additionally scans the inductive sensor 200 on the scan signal wires 901 to 90n along the scan direction SCD crossing the scan signal wires 901 to 90n to inspect an interlayer short between the signal wires 911 to 91m, 901 to 90n respectively formed at a separate layer.

As shown in FIGS. 11 and 12, the data signal wires 911 to 91m and the scan signal wires 901 to 90n are crossed on the substrate 100 by putting the insulation layer 101 between them.

During the interlayer short inspection between the data signal wires 911 to 91m and the scan signal wires 901 to 90n, the inductive sensor 200 scans the scan signal wires 901 to 90n with a non-contacting method, and then scans with the non-contacting method the data signal wires 911 to 91m. Alternately, the inductive sensor 200 may scan with non-contacting method along the data signal wires 911 to 91m and also may scan the scan signal wires 901 to 90n. If the insulation layer 101 is lost at the location having the data signal wires 911 to 91m and the scan signal wires 901 to 90n cross, due to a defective depositing process patterning process, the data signal wires 911 to 91m and the scan signal wires 901 to 90n are apt to be shorted at that point. As shown in FIG. 11, if the third data signal wire 913 and the second scan signal wire 902 are shorted, the low common voltage Vl is supplied to the scan signal wires 901 to 90n, and the high common voltage Vh is supplied to the data signal wire 911 to 91m. Accordingly, the current i flows between the third data signal wire 913 and the second scan signal wire 902 via the shorted point. The current i flows from the third data signal wire 913 to the second scan signal wire 902. If the current flows like this, when the inductive sensor 200 scans the third data signal wire 913 and the second scan signal wire 902, as shown in FIG. 10, an induced magnetic field 6 forms in the inductive sensor 200, and current i' begins to flow by being induced by the magnetic field 6. At this time, relatively high current i' is detected in the current detection circuit 7 (see FIG. 7). The control circuit 72 compares the current i detected by the current detection circuit 7 with a reference current set in advance. If the detected current i' is larger than the reference current, then an interlayer short has occurred.

On the other hand, if the low common voltage Vl is supplied to the scan signal wires 901 to 90n and the high common voltage Vh is supplied to the data signal wires 911 to 91m, as shown in FIG. 11, and if a short point 99 does not exist between the first, the second, the fourth to the $m_{th}$ data signal wires 911, 912, 914 to 91m and the first, the third to the $n_{th}$ scan signal wires 901, 903 to 90n, then the current i does not flow. Therefore, when the inductive sensor 200 scans the first, the second, the fourth to the $m_{th}$ data pads 931, 932, 934 to 93m and the first, the third to the $n_{th}$ scan signal pads 921, 923 to 92n, the induced magnetic field 6 does not induced the inductive sensor 200, and the nearly no current is detected in the current detection circuit 7.

If the inductive sensor 200 detects the current i upon scanning the data signal wires 911 to 91m and detects the current i upon scanning the scan signal wires 901 to 90n, the exact location where the interlayer short point exists is detected.

Figure 13:
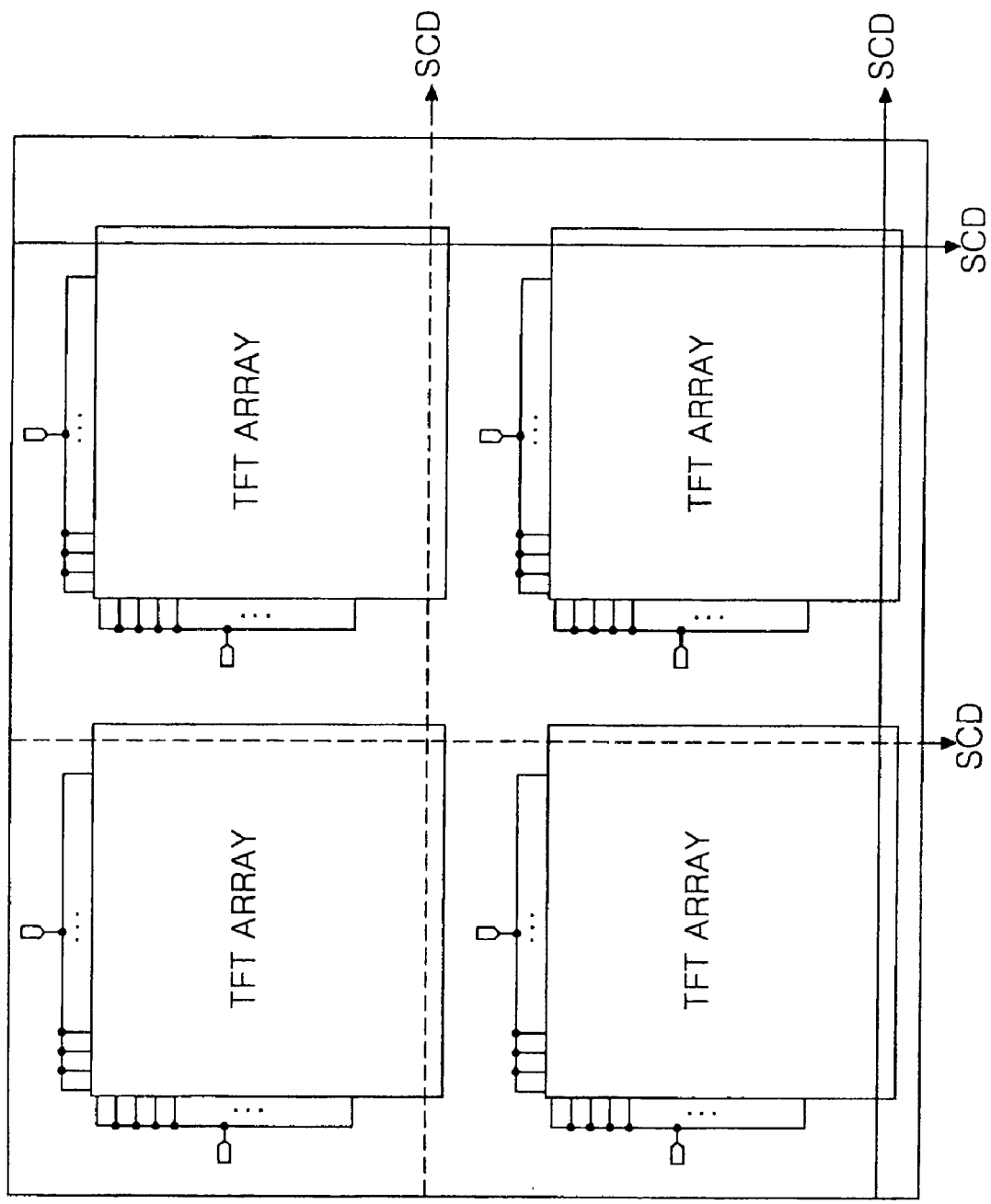
FIG. 13 illustrates a scan method performed on a substrate before being subjected to a scribing process in an inspection method and apparatus for a flat display according to a second embodiment of the invention.

As shown in FIG. 13, the interlayer inspection between the data signal wires 911 to 91m and the scan signal wires 901 to 90n can be collectively carried out simultaneously, on the substrate containing TFT arrays, before the scribing process. In this case, the inductive sensor 200 detects the current and the resistance by scanning in the scan direction SCD proceeding along the data signal wires 911 to 91m and the scan signal wires 901 to 90n.

Figure 14:
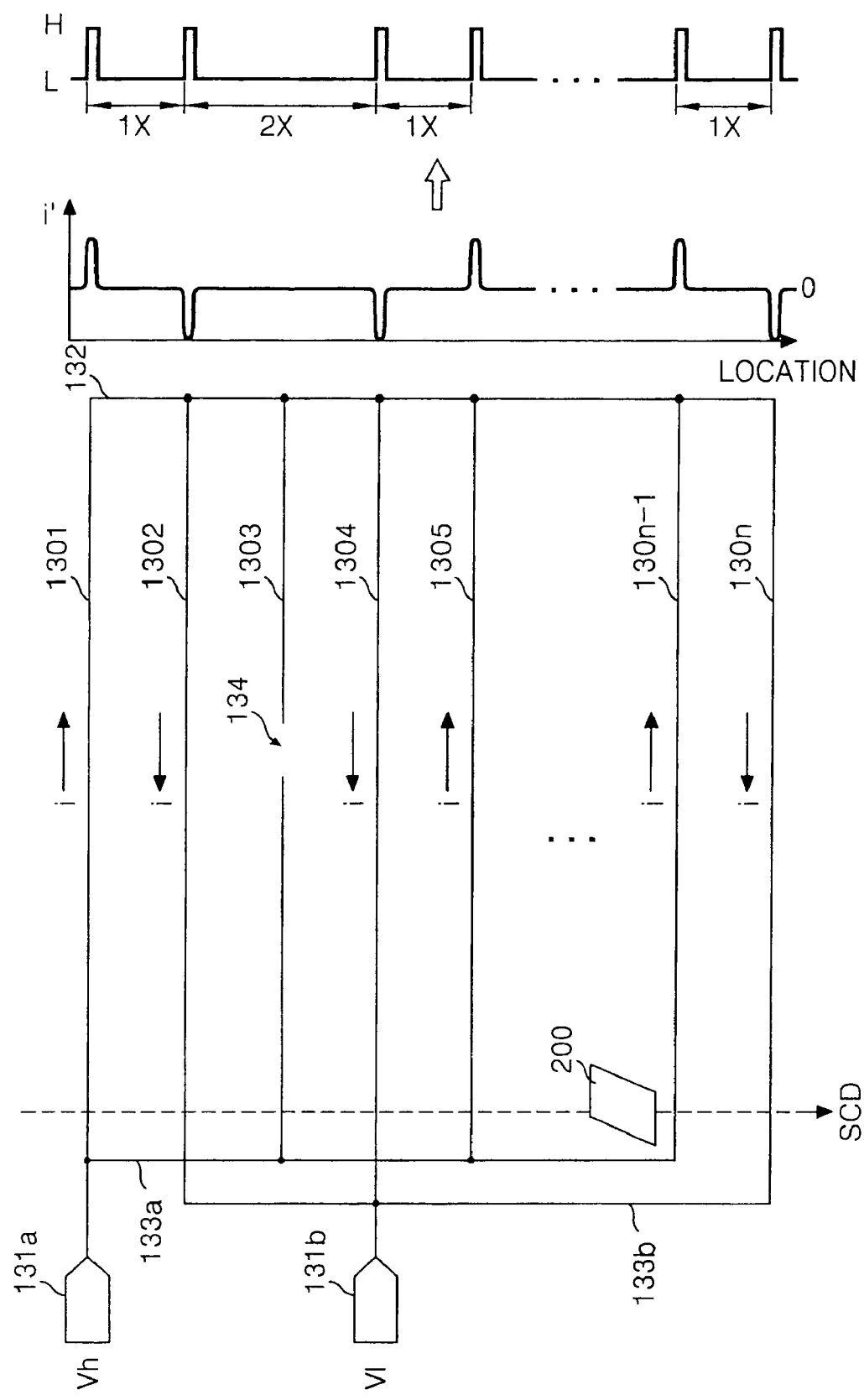
FIG. 14 illustrates an inspection method and apparatus for a flat display according to a third embodiment of the invention.
Figure 15:
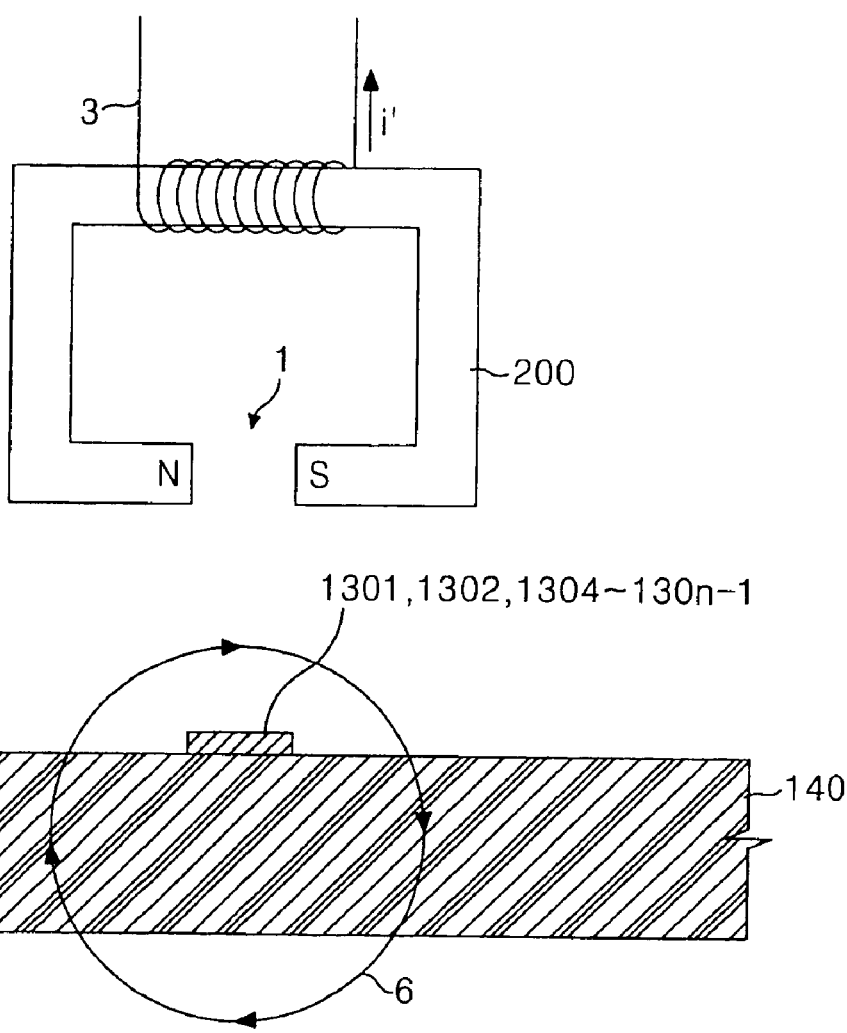
FIG. 15 is a cross sectional diagram illustrating an inductive sensor when current flows in the signal wire shown in FIG. 13.

FIG. 14 to FIG. 16 are diagrams illustrating the inspection method and apparatus for a flat display device according to the third embodiment of the invention, and shows one example of inspecting for the opening of the signal wires.

Referring to FIG. 14, in the inspection method and apparatus for a flat display device according to the third embodiment of the invention, the high common voltage (Vh) is supplied to one side of the odd-numbered signal wires 1301, 1303, . . . , 130n-1, and the low common voltage Vl is supplied to one side of the even-numbered signal wires 1302, 1304, . . . , 130n, causing the other side of the signal wires to be shorted.

As shown in FIGS. 15 and 16, the signal wire 1301 to 130n are scan signal wires formed on the substrate 140 of the flat display apparatus or the crossing data signal wires.

The odd-numbered signal wires are connected to a first shorting wire 133a. The first shorting wire 133a is connected to the first inspection pad 131a having the high common voltage (Vh) supplied. The even-numbered signal wires 1302, 1304, . . . , 130n connect to the second shorting wire 133b. The second shorting wire 133b connects to the second inspection pad 131b supplied with the low common voltage Vl.

The signal wires 1301 to 130n are connected to the third shorting wire 132 at the side opposite to the one to be shorted. On the other hand, the signal wires 1301 to 130n may short a protection device for electrostatic discharge damage (not shown) (hereinafter referred to as "ESD"). The reason is that the electrostatic discharge damage protection devices are respectively connected to the signal wires 1301 to 130n.

The inspection pads 131a and 131b, and the shorting wires 131a, 131b and 132 perform the inspection process, and then they are separated from the TFT array substrate during the scribing process.

The inspection method and apparatus according to the third embodiment of the invention scans, using the inductive sensor 200, the signal wires 1301 to 130n along the scan direction crossing the signal wires 1301 to 130n to inspect for the presence of open signal wires 1301 to 130n.

Upon the open inspection of the signal wires 1301 to 130n, the inductive sensor 200 scans the signal wires 1301 to 130n, using a non-contacting method, along the scan direction SCD crossing the signal wires 1301 to 130n. As shown in FIG. 14, it is assumed that the third signal wires 1303 opens at an open point 134 due to an impurity produced during the fabricating process or a bad pattern. While the current i flows in the first, the second signal wires 1301 and 1302 and the fourth to the $n_{th}$ signal wires 1304 to 130n, the current i does not flow by the open point 134 in the third signal wires 1303. At this time, the direction of the current i flowing in odd-numbered signal wires 1301, 1305, . . . , 130n-1 and the direction of the current i flowing in the even-numbered signal wires 1302, 1304, . . . , 130n are opposite to each other. Then, as shown in FIG. 15, the current i flows through the other signal wires 1301, 1302, 1304 to 130n except the third signal wire 1303, and the magnetic field 6 is induced in the inductive sensor 200 so that the current i' flows in the coil 3 of the inductive sensor 200.

In contrast, FIG. 15 shows the situation where the current i does not flow in the third signal wire 1303, the magnetic field is not induced in the inductive sensor 200. The current detection circuit 7 detects the current i' generated in the coil 3 of the inductive sensor 200. That is, the length of time a low or high field in sensed during a scan varies uniformly (1×, 1×, 1×, etc.) if there is no open circuit. However, if an open circuit is sensed, the field will be in the low or high state for about twice the usual time period (e.g., 1×, 2×, 1×, 1× . . . ). The 2× time period shows that an open circuit is present, as is shown in FIG. 14.

The current i' detected by the current detection circuit 7 is converted into the digital signal by the signal processing circuit 71, is amplified and then is displayed on the monitor 74 under the control the controlling circuit 72 and the monitor driving circuit 73, as shown in FIG. 7. When the detected current i' is smaller than the predetermined reference current, the controlling circuit 72 determines that the signal wire is opened. Accordingly, the inspector sees the data displayed on the monitor 74 and recognizes that the third signal wire 1303 is opened.

The open circuit inspection of the signal wires 1301 to 130n, as shown in FIG. 8, can be collectively carried out on the substrate, having the TFT arrays, before the scribing process. In this case, the inductive sensor 200 detects the current flowing in the signal wires 1301 to 130*n* by scanning along the scan direction SCD crossing the signal wires 1301 to 130*n*.

Figure 17:
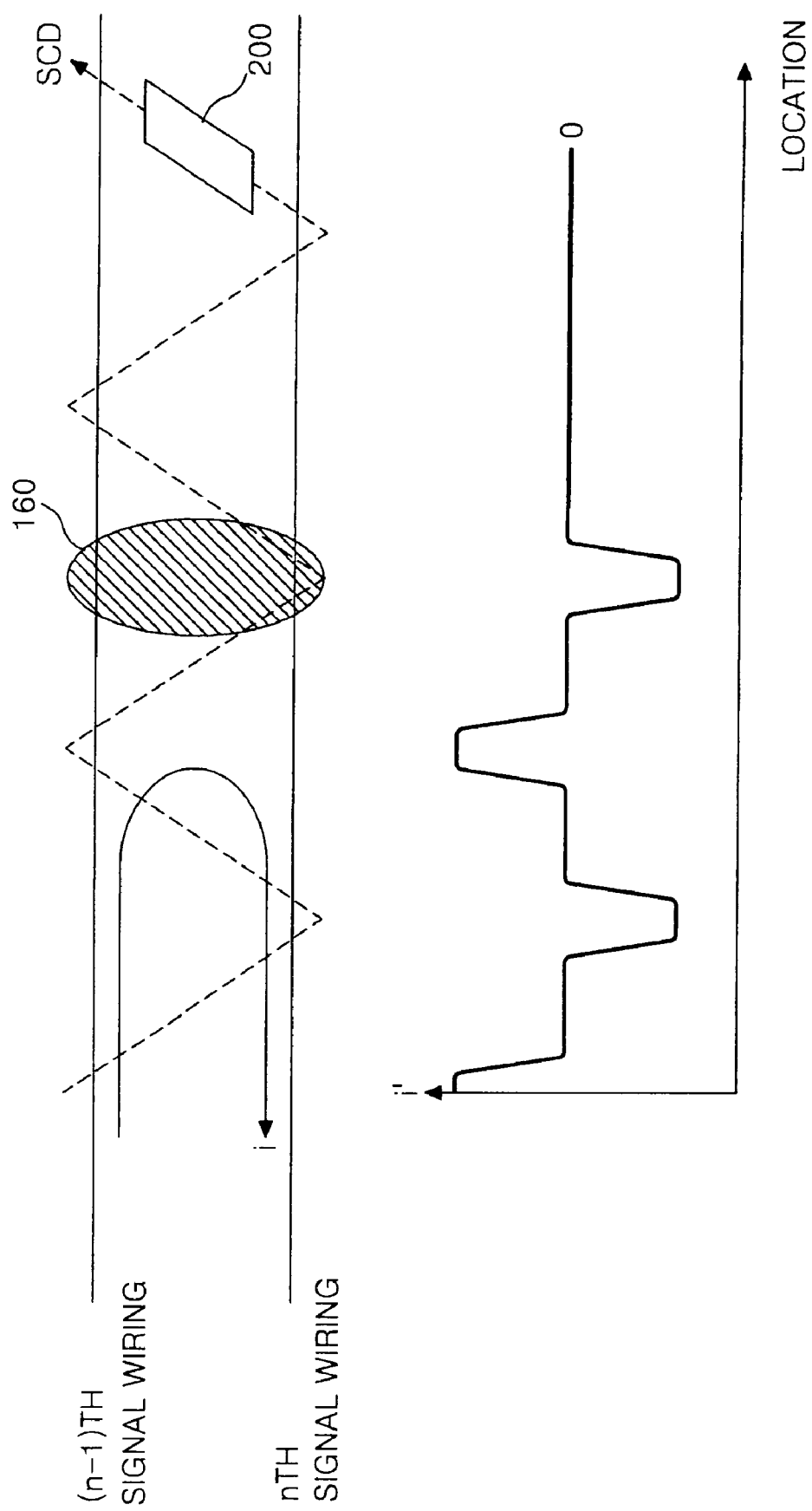
FIG. 17 illustrates an inspection method and apparatus for a flat display according to a fourth embodiment of the invention.

FIG. 17 illustrates the inspection method and apparatus for a flat display device according to a fourth embodiment of the invention.

Referring to FIG. 17, the inspection method and apparatus according to the fourth embodiment of the invention supplies the high common voltage to one side of the $(n-1)_{th}$ signal wire, supplies the low common voltage to one side of the $n_{th}$ signal wire, and inspects for openness of the signal wires by scanning in a zig-zag pattern the inductive sensor 200 on the $(n-1)_{th}$ signal wire and the $n_{th}$ signal wire.

The signal wires are the scan signal wire or the data signal wire.

During the openness inspection on the signal wires, the inductive sensor 200 is scanned by the non-contacting method along the scan direction SCD proceeding in a zig-zag pattern between $(n-1)_{th}$ signal wire and $n_{th}$ signal wire. If the inductive sensor 200 scans the interval of adjacent signal wires in a zig-zag pattern, the polarity of the current i' generated in the coil 3 in accordance with the direction of the current is periodically inverted. By the way, if $(n-1)_{th}$ signal wire and the $n_{th}$ signal wire is opened at the short point 160 due to an impurity introduced during the fabricating process or a bad pattern, and the inductive sensor 200 passes over the short point 160. Since the current i' does not flow in the $(n-1)_{th}$ signal wire and the $n_{th}$ signal wire, the magnetic field is not induced in the inductive sensor 200, and the current i' does not arise in the coil 3.

During the openness inspection on the signal wires, if the inductive sensor 200 scans in a zig-zag pattern, the current i' generated in the coil 3 of the inductive sensor 200 does not arise after the short point 160 upon one time scan. Therefore, the inspector need not scan the signal wires more than two times and can precisely find the location where the short point 160 exists by only one time scan.

Figure 18:
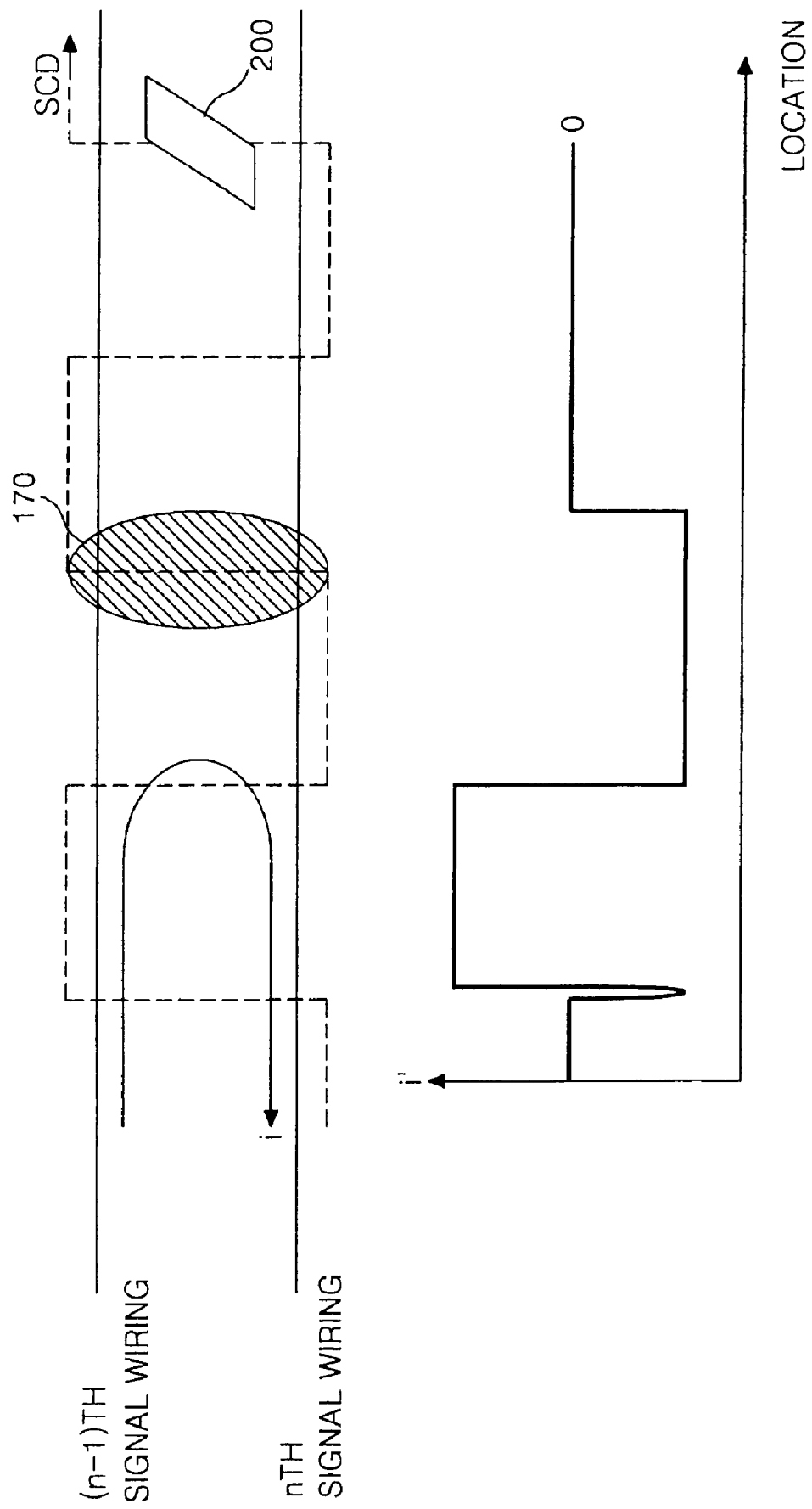
FIG. 18 illustrates an inspection method and apparatus for a flat display apparatus according to a fifth embodiment of the invention.

FIG. 18 illustrates the inspection method and the apparatus of the flat display apparatus according to a fifth embodiment of the invention.

Referring to FIG. 18, according to the inspection method and apparatus for flat display device according to a fifth embodiment of the invention, the high common voltage is supplied to one side of the $(n-1)_{th}$ signal wire, and the low common voltage is supplied to one side of the $n_{th}$ signal wire. The inspection proceeds in a straight direction parallel with the signal wire and then bends to a proceeding path in the vertical direction. The inductive sensor 200 scans on the $(n-1)_{th}$ signal wire and the $n_{th}$ signal wire along the scan direction (SCD) proceeding to the signal wire adjacent to the vertical with respect to the proceeding path to inspect for the presence of shorts in the signal wires.

The signal wires contain the scan signal wire or the data signal wire.

During the short inspection of the signal wires, the inductive sensor 200 scans the $(n-1)_{th}$ signal wire using a designated interval and then scans the $n_{th}$ signal wire by the designated interval. If the inductive sensor 200 scans the adjacent signal wires in a zig-zag pattern, the polarity of the current i' generated in the coil 3 periodically inverts in accordance with the direction of the current.

If the inductive sensor 200 passes over the short point 170, since the current i' does not flow in the $(n-1)_{th}$ signal wire and the $n_{th}$ signal wire, the magnetic field is not induced in the inductive sensor 200, and the current i' does not arise in the coil 3.

The inspector using this embodiment can exactly find the location where the short point 170 exists by using only one time scan.

As described above, the inspection method and apparatus for a flat display device according to the invention scans the magnetic sensor on the signal wires along the scan direction crossing the signal wires, or proceeds in a zig-zag pattern between the adjacent signal wires. As a result, the inspection method and the apparatus of the flat display apparatus according to the invention may rapidly and exactly finds defects such as a short circuit or an open circuit of the signal wire.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An inspection method for a flat display device, comprising:

scanning signal wires by using a magnetic sensor along a scan direction crossing a plurality of the signal wires; and detecting at least one of a short or an open circuit in the signal wires based on a current of the signal wires detected by the magnetic sensor.

2. The inspection method according to claim 1, wherein detecting the short on the signal wires includes:

supplying a first common voltage to one side of odd-numbered signal wires within the plurality of signal wires;

supplying a second common voltage different from the first common voltage to one side of even-numbered signal wires within the plurality of signal wires; and maintaining the other side of each of the signal wires in an insulated state.

3. The inspection method according to claim 1, wherein detecting the short on the signal wires includes:

detecting a short point by scanning the shorted signal wires along a second scan direction identical with a longitudinal direction of the signal wires.

4. The inspection method according to claim 1, wherein detecting the open circuit on the signal wire includes:

supplying a first common voltage to one side of odd-numbered signal wires;

supplying a second common voltage different from the first common voltage to one side of even-numbered signal wires; and shorting the other side of each of the signal wires.

5. An inspection method, which comprises:

providing a flat display device having at least one of first signal wires and at least one of second signal wires stacked on the first signal wire, and an insulation layer is located between the first and the second signal wires;

scanning the second signal wires along a first scan direction crossing the first signal wires and a second scan direction crossing the second signal wires by using a magnetic sensor; and detecting an interlayer short on the signal wires based on a current of the signal wires detected by the magnetic sensor.

6. The inspection method according to claim 5, further comprising:
   supplying a first common voltage to one side of the first signal wires;
   supplying a second common voltage different from the first common voltage to one side of the second signal wires; and
   maintaining an other side of each of the first and the second signal wires in an insulated state.

7. An inspection method for a flat display device, comprising:
   scanning signal wires by using a magnetic sensor along a scan direction proceeding in a zig-zag pattern; and
   detecting a short in the signal wires based on a current of the signal wires detected by the magnetic sensor.

8. The inspection method according to claim 7, further comprising:
   supplying a first common voltage to one side of a first signal wire of adjacent signal wires;
   supplying a second common voltage different from the first common voltage to one side of a second signal wire adjacent to the first signal wire; and
   maintaining the other side of each of the signal wires in an insulated state.

9. An apparatus for inspecting a flat display device, comprising:
   a magnetic sensor for scanning on signal wires along a scan direction crossing a plurality of the signal wires; and
   a detection circuit for detecting at least one of a short or an open circuit on the signal wires, the detection circuit being formed based on current of the signal wires detected by the magnetic sensor.

10. The apparatus according to claim 9, wherein the magnetic sensor comprises one of an inductive sensor, a giant magneto-resistance sensor, a magneto-resistance sensor, a tunneling magneto-resistance sensor or a fluxgate sensor.

11. The apparatus according to claim 9, further comprising:
   a first power supply for supplying a first common voltage to one side of odd-numbered signal wires; and
   a second power supply for supplying the second common voltage different from the first common voltage to one side of even-numbered signal wires.

12. The apparatus according to claim 11, wherein an other side of each of the signal wires is maintained in an insulated state during a short inspection of the signal wires.

13. The apparatus according to claim 9, wherein the magnetic sensor performs a secondary scanning on at least one of the shorted signal wires along a second scan direction parallel with a longitudinal direction of the signal wires to locate a shorted point.

14. The apparatus according to claim 11, wherein an other side of each of the signal wires is shorted upon an open circuit inspection of the signal wires.

15. An inspection apparatus for a flat display device having at least one of a first signal wire, an insulation layer over the first signal wire, and a second signal wire over the insulation layer, the inspection apparatus comprising:
   a magnetic sensor for scanning the first and the second signal wires along a first scan direction crossing the first signal wire and a second scan direction crossing the second signal wire; and
   a detection circuit for detecting an interlayer short in the signal wires based on a current of the signal wires detected by the magnetic sensor.

16. The inspection apparatus according to claim 15, wherein the magnetic sensor is one of an inductive sensor, a giant magneto-resistance sensor, a magneto-resistance sensor, a tunneling magneto-resistance sensor or a fluxgate sensor.

17. The inspection apparatus according to claim 15, further comprising:
   a first power supply for supplying a first common voltage to one side of the first signal wire; and
   a second power supply for supplying a second common voltage different from the first common voltage to one side of the second signal wire.

18. The inspection apparatus according to claim 17, wherein an other side of each of the first and the second signal wires is maintained in an insulated state.

19. An inspection apparatus for a flat display device, comprising:
   a magnetic sensor for scanning signal wires along a scan direction proceeding in a zig-zag pattern between adjacent signal wires; and
   a detection circuit for detecting a short on the signal wires based on a current of the signal wires detected by the magnetic sensor.

20. The inspection apparatus according to claim 19, wherein the magnetic sensor is one of an inductive sensor, a giant magneto-resistance sensor, a magneto-resistance sensor, a tunneling magneto-resistance sensor or a fluxgate sensor.

21. The inspection apparatus according to claim 19, further comprising:
   a first power supply for supplying a first common voltage to one side of a first signal wire of the adjacent signal wires; and
   a second power supply for supplying a second common voltage different from the first common voltage to one side of a second signal wire adjacent to the first signal wire.

22. The inspection apparatus according to claim 21, wherein an other side of each of the signal wires is maintained in an insulated state.

23. The inspection method according to claim 5, wherein the magnetic sensor has a gap that is less than a width of the signal wires.

24. The apparatus according to claim 15, wherein the magnetic sensor has a gap that is less than a width of the signal wires.

* * * * *